(12) United States Patent
Jang et al.

(10) Patent No.: US 8,154,122 B2
(45) Date of Patent: Apr. 10, 2012

(54) SEMICONDUCTOR PACKAGE AND METHODS OF MANUFACTURING THE SEMICONDUCTOR PACKAGE

(75) Inventors: Chul-Yong Jang, Yongin-si (KR); Pyoung-Wan Kim, Suwon-si (KR); Teak-Hoon Lee, Hwaseong-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 256 days.

(21) Appl. No.: 12/469,253

(22) Filed: May 20, 2009

(65) Prior Publication Data

US 2009/0289359 A1    Nov. 26, 2009

(30) Foreign Application Priority Data

May 26, 2008   (KR) .................. 10-2008-0048732

(51) Int. Cl.
*H01L 23/48*   (2006.01)
(52) U.S. Cl. ........ 257/737; 257/738; 257/747; 257/772; 257/777; 257/779; 257/E21.508
(58) Field of Classification Search ........................ None
See application file for complete search history.

(56) References Cited

U.S. PATENT DOCUMENTS

| | | | | |
|---|---|---|---|---|
| 5,027,995 A | * | 7/1991 | Karl et al. | 228/111 |
| 5,293,072 A | | 3/1994 | Tsuji et al. | |
| 5,869,904 A | * | 2/1999 | Shoji | 257/779 |
| 6,187,612 B1 | | 2/2001 | Orcutt | |
| 2005/0006789 A1 | * | 1/2005 | Tomono et al. | 257/778 |
| 2006/0113668 A1 | * | 6/2006 | Ishikawa et al. | 257/737 |

FOREIGN PATENT DOCUMENTS

| | | |
|---|---|---|
| JP | 04-062865 | 2/1992 |
| JP | 11-274367 | 10/1999 |
| JP | 2000-216179 | 8/2000 |
| JP | 2000-252310 | 9/2000 |
| KR | 1996-0000599 | 1/1996 |

* cited by examiner

*Primary Examiner* — N Drew Richards
*Assistant Examiner* — Kyoung Lee
(74) *Attorney, Agent, or Firm* — Stanzione & Kim, LLP

(57) ABSTRACT

A semiconductor package and a method of manufacturing the semiconductor package are provided. A semiconductor package according to the present general inventive concept may include a base substrate having one surface on which a connection terminal is formed and a first package substrate having a molding layer covering the base substrate. The molding layer faces a circumference of the connection terminal and includes a side surface having first and second surfaces having a circumference of a different size, respectively.

11 Claims, 14 Drawing Sheets

SEMICONDUCTOR PACKAGE AND METHODS OF MANUFACTURING THE SEMICONDUCTOR PACKAGE

CROSS-REFERENCE TO RELATED APPLICATIONS

This U.S. non-provisional patent application claims priority under 35 U.S.C. §119 from Korean Patent Application No. 2008-48732, filed on May 26, 2008, the entire contents of which are herein incorporated by reference in their entirety.

BACKGROUND

1. Field of the Invention

The present general inventive concept relates to a semiconductor package and methods of manufacturing the same, and more particularly, to a semiconductor package having an improved joint reliability of a connection terminal and methods of manufacturing the same.

2. Description of the Related Art

A ball grid array (BGA) package is a package of a high density surface mounting type using a printed circuit board (PCB) instead of a lead frame. The ball grid array (BGA) may include a ceramic ball grid array (CBGA), a plastic ball grid array (PBGA), a tape ball grid array (TBGA), a metal ball grid array (MBGA) and a fine pitch ball grid array (FBGA).

A general ball grid array package uses a solder ball as a connection terminal electrically connecting a semiconductor chip and a substrate (e.g., a printed circuit substrate). A semiconductor chip is mounted on another substrate (e.g., a package substrate) and the solder ball may be disposed as a lattice shape between the package substrate and a printed circuit substrate. The solder ball may electrically connect the semiconductor chip and the printed circuit substrate, and also physically combine the semiconductor chip and the printed circuit substrate.

However, a solder ball of a general semiconductor package may be easily damaged by a variation of a temperature and an external physical shock. For example, when an external physical shock such as a bend of a substrate is applied to a substrate, a crack may occur in a solder ball due to the external physical shock or an interconnection formed on a connection pad and a substrate may be taken out of a surface of a substrate due to a separation of a solder ball. In this case, since an electric signal cannot be transferred between the semiconductor chip and the substrate through the solder ball, a joint reliability of the solder ball is deteriorated.

SUMMARY

The present invention general inventive concept provides semiconductor package having an improved joint reliability of a connection terminal and methods of manufacturing the same.

Additional aspects and/or utilities of the present general inventive concept will be set forth in part in the description which follows and, in part, will be obvious from the description, or may be learned by practice of the general inventive concept.

The foregoing and/or other aspects and utilities of the general inventive concept may be achieved by providing a semiconductor package. The semiconductor package may include, among other things, a first package substrate including a base substrate having one surface on which a connection terminal is formed and a molding layer covering the base substrate. The molding layer has a side surface facing a circumference of the connection terminal. The side surface includes a first surface and a second surface having circumferences of a different size.

The foregoing and/or other aspects and utilities of the general inventive concept may also be achieved by providing a method of manufacturing a semiconductor package. The method may include, among other things, manufacturing a first package substrate which covers a base substrate including a preliminary connection terminal and a portion of the preliminary connection terminal and has a molding layer that a region adjacent to the preliminary connection terminal is recessed, and combining the first package substrate with a second package substrates.

The foregoing and/or other aspects and utilities of the general inventive concept may also be achieved by providing a method of manufacturing a semiconductor package, the method including, among other things, manufacturing a first package substrate including a base substrate, forming a connection terminal on at least one surface of the base substrate, forming a molding layer covering the base substrate, where the formed molding layer has a side surface facing a circumference of the formed connection terminal, the side surface including a first surface and a second surface having circumferences of a different size.

The method may further include manufacturing a second package substrate which faces the first package substrate, combining the manufactured second package substrate with the with the first package substrate, joining the first solder portion to the first package substrate and a second solder portion joined to the second package substrate, and forming the first surface to surround a circumference of the first solder portion and forming the second surface to surround a circumference of the second solder portion, where the circumference of the second surface is greater than the circumference of the first surface.

The method may further include concavely rounding the second surface toward the base substrate.

The method may further include gradually increasing the circumference of the second surface from the first solder portion to the second solder portion.

The method may further include forming the second solder portion to extend from the first solder portion.

The method may further include locating the first surface in contact with the circumference of the first solder portion and the second surface in contact with the circumference of the second solder portion.

The method may further include locating the first solder portion in contact with a corner such that the first surface and the second surface meet each other, where the first solder portion includes a polymer collar.

The method may further include where the first solder portion includes a polymer collar and covering the polymer collar with at least the first surface.

The method may further include where the first solder portion includes a polymer collar, and positioning one surface of the base substrate and a corner such that the first surface and the second surface meet each other at a distance that is greater than a distance between the one surface of the base substrate and a top of the polymer collar.

The method may further include positioning one surface of the base substrate and a corner such that the first surface and the second surface to meet each other at a distance that is smaller than half of a distance between the one surface of the base substance and a height of the connection terminal.

The method may further include manufacturing a joining area of the second solder portion that is joined to the second package substrate that is greater than a joining area of the first solder portion joined to the first package substrate.

The method may further include manufacturing a radius of curvature of the second solder portion that is greater than a radius of curvature of the first solder portion.

The foregoing and/or other aspects and utilities of the general inventive concept may also be achieved by providing a semiconductor package, including, among other things, a first package substrate including a base substrate having a preliminary connection terminal and a molding layer to cover a portion of the preliminary connection terminal, where the first package substrate is combined with a second package substrate, and where the molding layer in which a region adjacent to the preliminary connection terminal is recessed.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
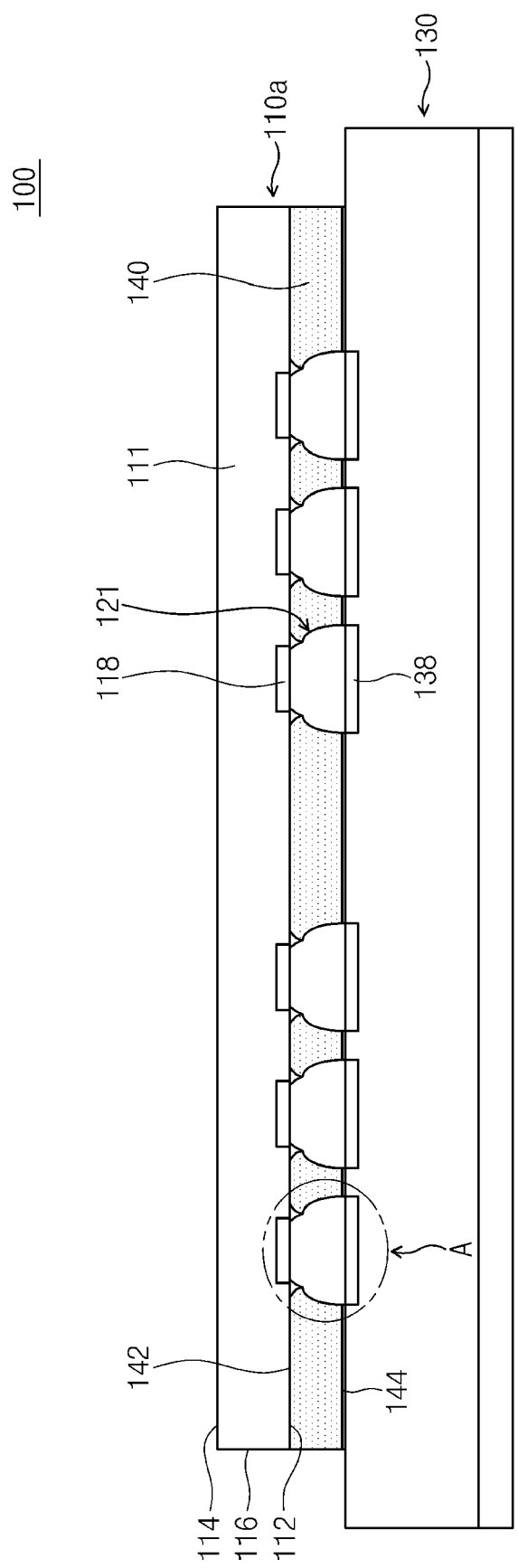
FIG. 1 illustrates a view of a semiconductor package according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments of the present general inventive concept and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present general inventive concept may be described with reference to cross-sectional illustrations, which are illustrations of idealized embodiments of the present invention. As such, variations from the shapes of the illustrations, as a result, for example, of manufacturing techniques and/or tolerances, are to be expected. Thus, embodiments of the present general inventive concept should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present general inventive concept.

Unless otherwise defined, all terms (including technical and scientific terms) used herein have the same meaning as commonly understood by one of ordinary skill in the art to which the present general inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation illustrated in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Figure 2:
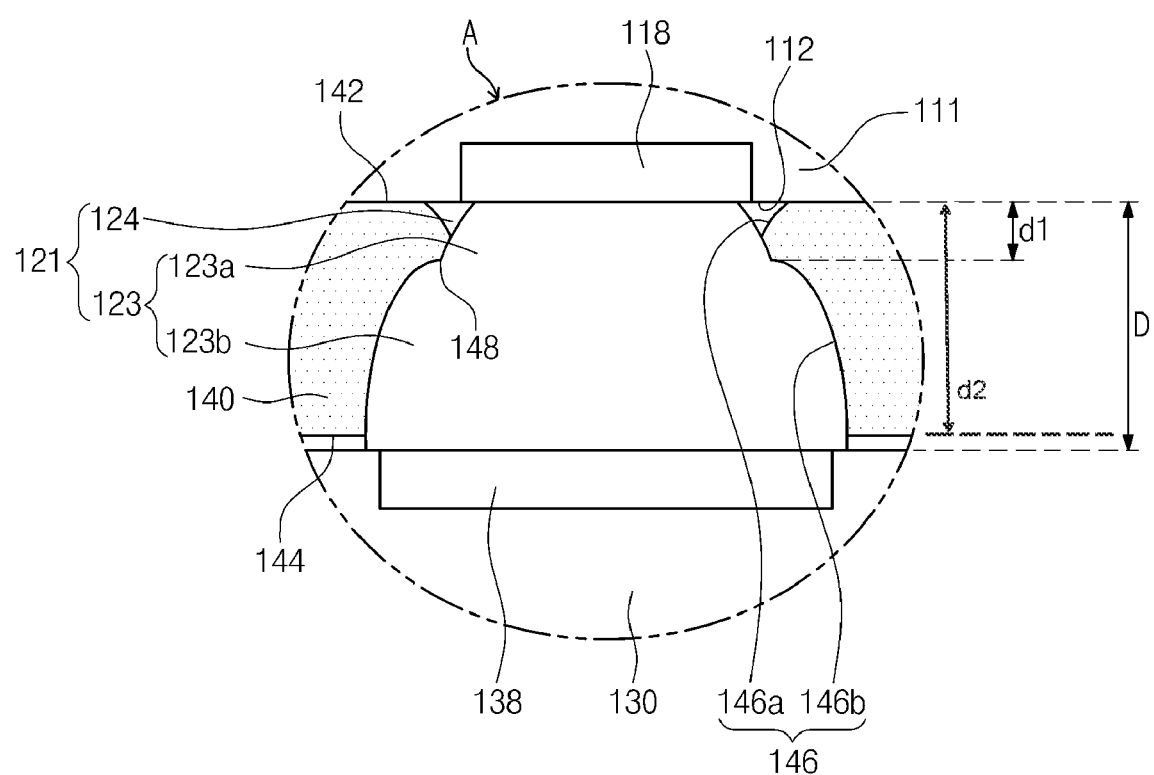
FIG. 2 is an enlarged view of "A" region illustrated in FIG. 1.

FIG. 1 illustrates a top plan view of a semiconductor package according to an embodiment of the present general inventive concept, and FIG. 2 illustrates an enlarged view of "A" region illustrated in FIG. 1.

Referring to FIGS. 1 and 2, a semiconductor package 100 according to the present general inventive concept may include a first package substrate 110a and a second package substrate 130 which are combined with each other by a connection terminal 121. The first package substrate 110a may include a base substrate 111 and a molding layer 140. A semiconductor chip (not illustrated) may be mounted on the base substrate 111. The base substrate 111 may include a front surface 112, a back surface 114 and a side surface 116. A connection pad 118 electrically connected to the semiconductor chip mounted on the base substrate 111 may be formed on the front surface 112. The molding layer 140 may protect the base substrate 111 from chemical/physical external environments. The molding layer 140 may be formed of a material of a resin system, or an epoxy molding compound (EMC), or any other suitable material. The molding layer 140 may be formed to cover the front surface 112 of the base substrate 111. In another embodiment, the molding layer 140 may be formed to cover the front surface 112 and the side surface 116 of the base substrate 111. In still another embodiment, the molding layer 140 may be formed to cover the front surface 112, the back surface 114 and the side surface 116 of the base substrate 111.

The second package substrate 130 may be a substrate on which circuit patterns (not illustrated) for electrically operating the semiconductor chip mounted on the base substrate 111 are formed. For example, the second package substrate 130 may be a printed circuit board (PCB) on which a ball land region 138 is formed. The ball land region 138 may be a region with which the connection terminal 121 is joined.

The connection terminal 121 may transmit an electric signal between the semiconductor chip and the second package substrate 130. The connection terminal 121 may be disposed between the first package substrate 110a and the second package substrate 130. The connection terminal 121 may be a resultant structure formed by performing a reflow of a solder ball provided onto the first package substrate 110a so as to combine the solder ball with the ball land region 138 of the second package substrate 130. The connection terminal 121 may include a solder portion 123 and a polymer collar 124. The solder portion 123 may include a first solder portion 123a joined to the connection pad 118 and a second solder portion 123b joined to the ball land region 138. The second solder portion 123b may be formed to extend from the first solder portion 123a. In an embodiment of the present general inventive concept, the first and second solder portions 123a and 123b may be formed of a same conductive material without an interface between the first and second solder portions 123a and 123b. In another embodiment of the present general inventive concept, the first and second portions 123a and 123b may be formed from different conductive materials, with a conductive interface between the first and second portions 123a and 123b. The polymer collar 124 may be formed along a joining part of the first solder portion 123a. The polymer collar 124 may reinforce a joint of the first package substrate 110a and the first solder portion 123a.

A joining area of the first solder portion 123a joined to the first package substrate 110a may be different from a joining area of the second solder portion 123b joined to the second package substrate 130. For example, a joining area of the second solder portion 123b joined to the second package substrate 130 may be greater than, less than, or equal to a joining area of the first solder portion 123a joined to the first package substrate 110a. A maximum circumference of the second solder portion 123b may be greater than, less than, or equal to a maximum circumference of the first solder portion 123a. A radius of curvature of the second solder portion 123b may be greater than, less than, or equal to a radius of curvature of the first solder portion 123a. In the semiconductor package having the structure described above, since an area of the connection terminal 121 joined to the second package substrate may increase, a solder joint reliability of the connection terminal 121 may increase.

The molding layer 140 may include an inner side surface 142 which is in contact with the base substrate 111, an external side surface 144 exposed to the outside, and a side surface 146 facing the connection terminal 121. The side surface 146 may include a first side surface 146a facing the first solder portion 123a of the connection terminal 121, and a second side surface 146b facing the second solder portion 123b of the connection terminal 121. The first and second side surfaces 146a and 146b may be in contact with the first and second solder portion 123a and 123b, respectively. The first side surface 146a may be a side surface which extends along a surface of the first solder portion 123a. The second side surface 146b may be a side surface which extends to the external side surface 144 from an edge of the first side surface 146a. The second side surface 146b may be concavely rounded toward the front surface 112.

The first and second side surfaces 146a and 146b are in contact with each other to form a corner 148. The first side surface 146a and the corner 148 may be in contact with the first solder portion 123a. The molding layer 140 may be formed to cover at least the polymer collar 124. That is, a distance (d1, hereinafter it is referred to as a first distance) from the front surface 112 to the corner 148 may be equal to or greater than a distance from the front surface 112 to a top of the polymer collar 124. Generally, a crack of the connection terminal 121 generated from an external shock may occur in a lower part of the first solder portion 123a where the polymer collar 124 is formed. Thus, the molding layer 140 may protect the lower part of the first solder portion 123a and minimize and/or prevent a damage of the connection terminal 121 due to an external shock.

The first distance (d1) may be smaller than half of a distance (D) from the front surface 112 to a height of the connection terminal 121. If the first distance (d1) is greater than half of a distance (D) from the front surface 112 to a height of the connection terminal 121, a size of the second solder portion 123b may become relatively small compared with a size of the first solder portion 123a. Also, a distance (d2, hereinafter it is referred to as a second distance) from the front surface 112 to the external side surface 144 of the molding layer 140 may be equal to or smaller than a distance (D) from the front surface 112 to a height of the connection terminal 121. In addition, the second distance (d2) may be greater than half of the distance (D) from the front surface 112 to a height of the connection terminal 121. The molding layer 140 may have a thickness which can sufficiently protect the first package substrate 110a from chemical/physical external environments.

Figure 3:
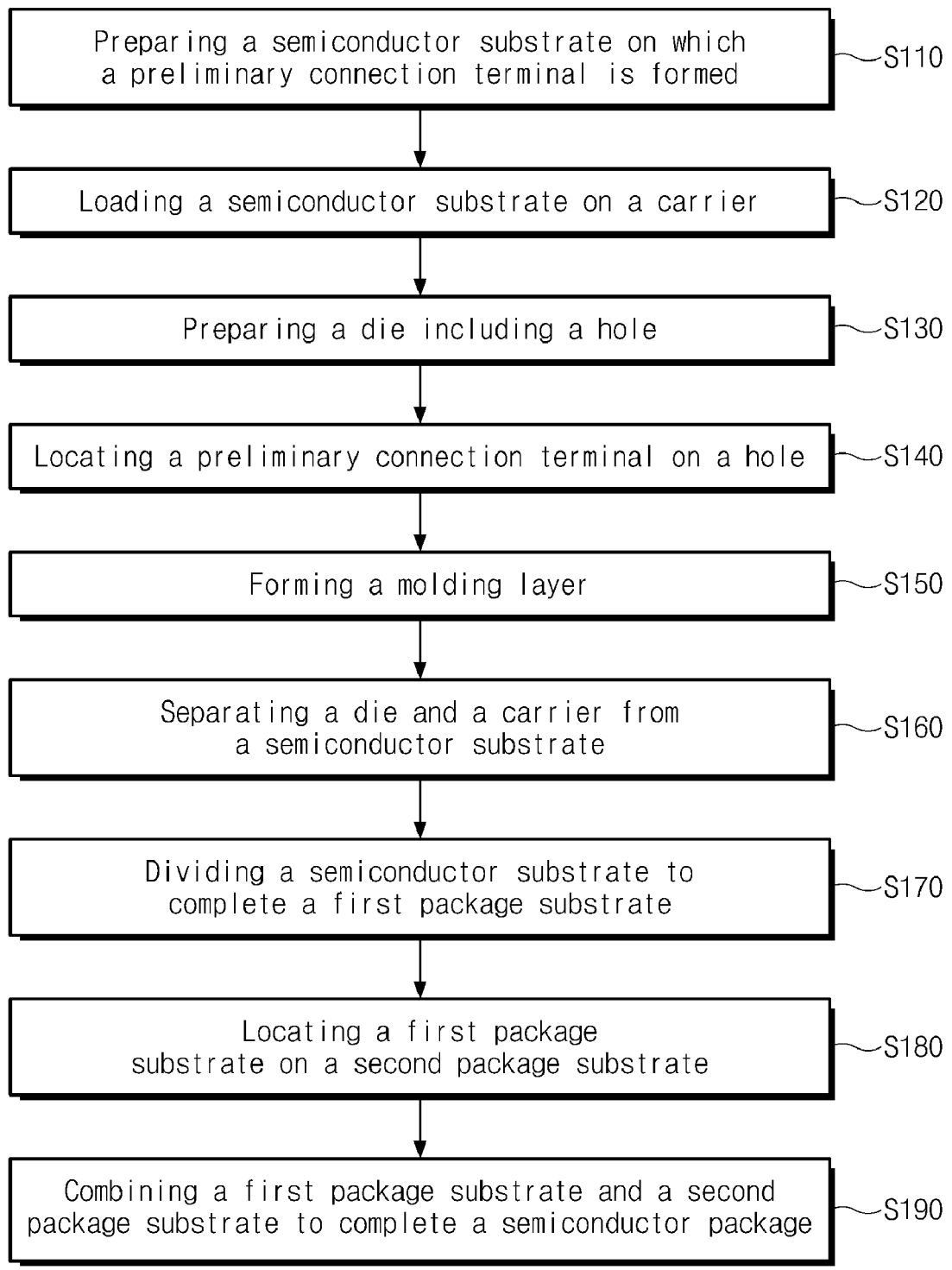
FIG. 3 is a flow chart illustrating a method of manufacturing the semiconductor package illustrated in FIG. 1.

A process of manufacturing the semiconductor package described above will be described in detail. FIG. 3 is a flow chart illustrating a method of manufacturing the semiconductor package illustrated in FIG. 1. FIGS. 4 through 11 are views illustrating a process of manufacturing the semiconductor package illustrated in FIG. 1.

Figure 4:
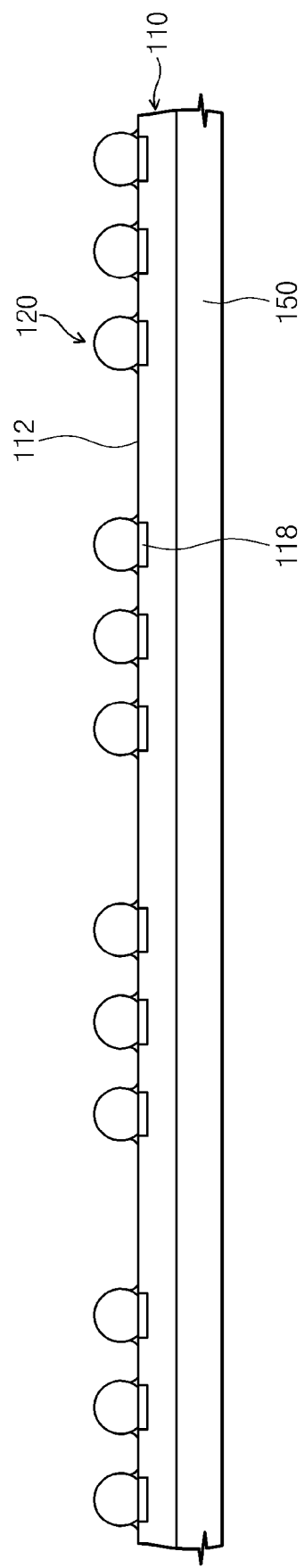
FIGS. 4 through 11 are views illustrating a process of manufacturing the semiconductor package illustrated in FIG. 1.

Referring to FIGS. 3 and 4, a semiconductor substrate 110 including a preliminary connection terminal 120 is prepared at operation S110. The semiconductor substrate 110 may be a substrate of a wafer level on which a plurality of semiconductor chips (not illustrated) is mounted. The semiconductor substrate 110 may include a front surface 112 on which a connection pad 118 is formed. The preliminary connection terminal 120 is welded on the connection pad 118. The preliminary connection terminal 120 may be electrically connected to the semiconductor chip.

The semiconductor substrate 110 is loaded on a carrier 150 at operation S120. For example, the semiconductor substrate 110 of a wafer level may be attached to the carrier 150. In another embodiment, after the semiconductor substrate 110 of a wafer level is divided into a chip sized substrates by cutting, each of the divided substrates may be attached to the carrier 150. In this case, each of the chip sized substrates may be disposed to be spaced a predetermined distance apart from each other according to a size of a semiconductor package which will be manufactured.

The carrier 150 may be one selected from a group consisting of a metal material, a ceramic material and an organic material. The carrier 150 may relieve a physical stress applied to the semiconductor substrate 110 during a subsequent process forming a molding layer on a surface of the semiconductor substrate 110. An adhesive material layer (not illustrated) may be provided between the semiconductor substrate 110 and the carrier 150. The adhesive material layer may a thing to easily separate the semiconductor substrate 110 from the carrier 150. An adhesive tape including ultraviolet curable resin or thermoplastic resin may be used as the adhesive material layer.

Figure 5:
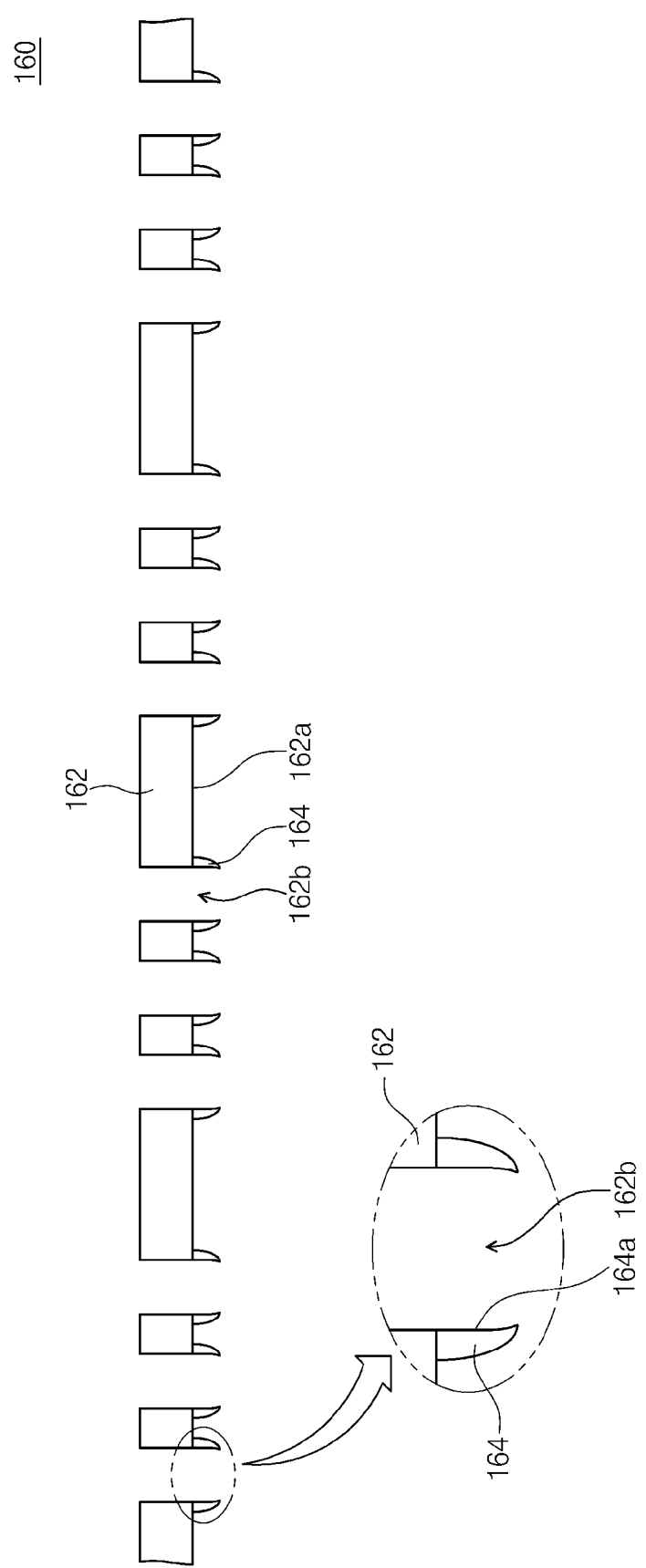

Referring to FIGS. 3 and 5, a die 160 including a hole 162b is prepared at operation S130. The die 160 may include a plate 162 having an external surface 162a facing the front surface 112 of the semiconductor substrate 110. The plate 162 may heat the molding material to form a specific shape of the molding material. The hole 162b may be disposed so as to correspond the preliminary connection terminal 120 formed on the semiconductor substrate 110.

The die 160 may further include a packing 164 formed on the hole 162b. The packing 164 may have a ring shape, a tooth shape, or other suitable shape. The packing 164 may have an inner side surface 164a which is in contact with the preliminary connection terminal 120. A portion of the inner side surface 164a may have a shape corresponding to a surface of the preliminary connection terminal 120. For example, since the preliminary connection terminal 120 has generally a sphere shape, the inner side surface 164a may be rounded so as to correspond to a surface of the preliminary connection terminal 120. The packing 164 may be formed of a material having elasticity. In addition, the packing 164 may be formed of a material having a thermal resistance which is not deformed at a temperature equal to or greater than 100° C. The packing 164 may be formed of a material such as resin, rubber, or plastic, or any other suitable material, such as a composite material. When the packing 164 is formed of resin, the packing 164 may be formed of ultraviolet curable resin or thermoplastic resin.

Figure 6:
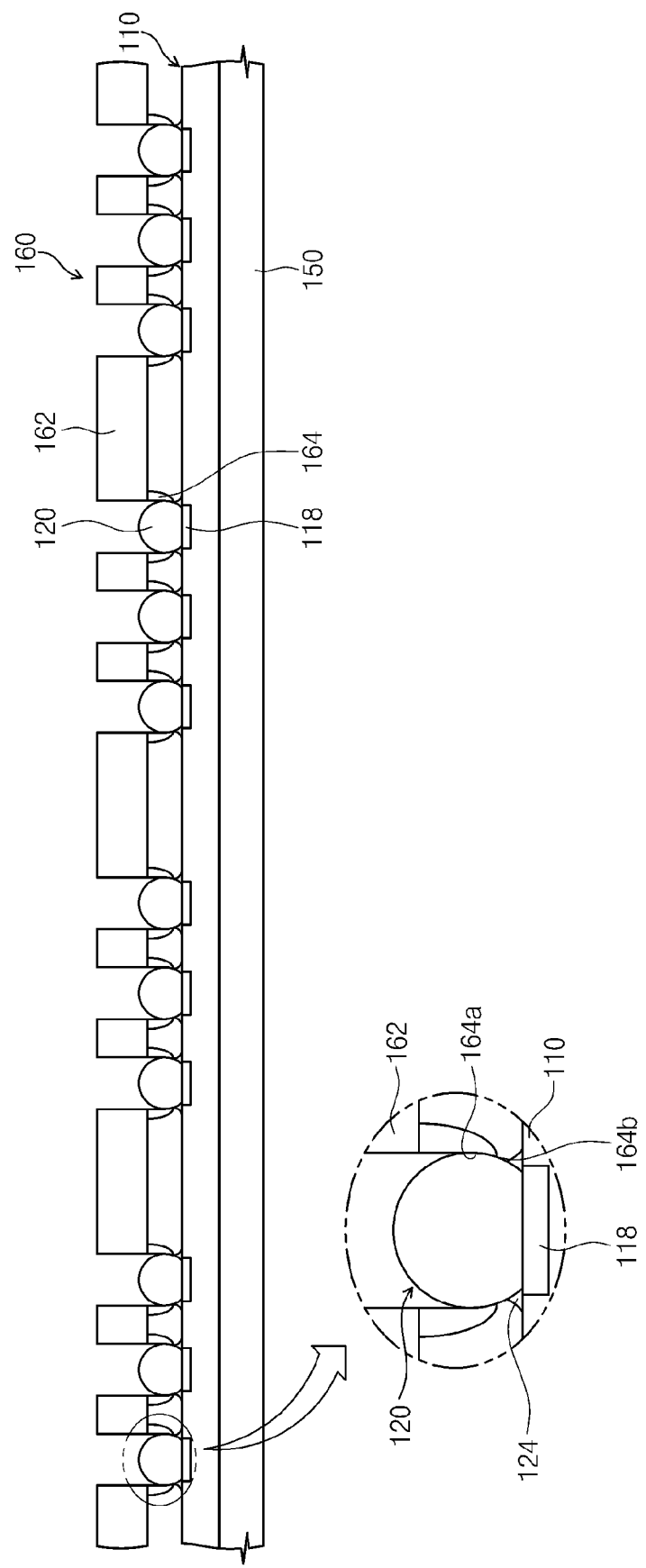

Referring to FIGS. 3 and 6, the die 160 is disposed on the semiconductor substrate 110 so that the preliminary connection terminal 120 is placed on the packing 164 at operation S140. A step of locating the plate 162 on an upper part of the semiconductor substrate 110 and a step of locating the packing 164 on the preliminary connection terminal 120 may be sequentially performed. Since the packing is formed of a material having elasticity, a portion of the preliminary connection terminal 120 may be inserted into the packing 164. A portion of the preliminary connection terminal 120 may be in contact with the inner side surface 164a of the packing 164.

A portion where an edge 164b of the packing 164 is in contact with the preliminary connection terminal 120 may be a portion forming a corner 148 of the molding layer 140 described in connection with FIG. 2. That is, as described above, the corner 148 may be a portion to distinguish the first surface 146a and the second surface 146b of the molding layer 140. Thus, the edge 164b of the packing 164 may be located so that the first surface 146a of the molding layer 140 at least covers the polymer collar 124. For example, the die 160 may be located on the semiconductor substrate 110 so that a top 164b of the packing 164 is not contact with the polymer collar of the preliminary connection terminal 120. Or, the die 160 may be located on the semiconductor substrate 110 so that a top 164b of the packing 164 is contact with the polymer collar of the preliminary connection terminal 120.

Figure 7:
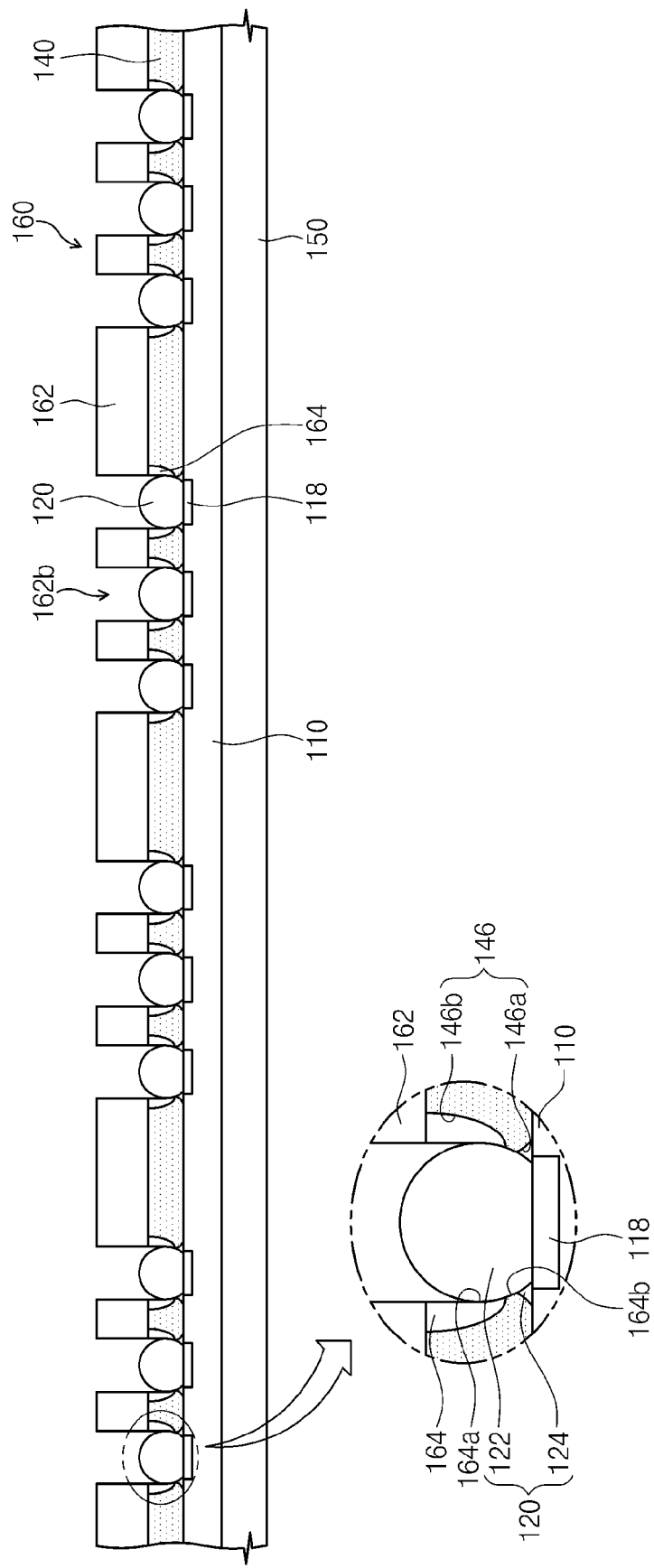

Referring to FIGS. 3 and 7, a molding layer 140 is formed on a surface of a semiconductor substrate 110 at operation S150. The molding layer 140 can protect the semiconductor substrate 110 and/or minimize damage from external chemical/physical environments. The molding layer 140 may be formed by injecting a molding material between the semiconductor substrate 110 and the die 160. The molding material may be a material including a material of a resin system, an epoxy molding compound (EMC), or a composite material, or any other suitable material. A process of forming the molding layer 140 may be performed in an environment having a temperature of 100° C. to 150° C. The molding layer 140 may include a first surface 146a which is in contact with the polymer collar of the preliminary connection terminal 120 and a second surface 146b which is in contact with the packing 164. The second surface 146b is spaced apart from the preliminary connection terminal 120 by the packing 164. The molding layer 140 may have a groove (149 of FIG. 9) in a region adjacent to a circumference of the preliminary connection terminal 120. A description of the groove 149 will be described in detail below.

Forming the molding layer 140 may include applying an inhalation pressure to the hole 162b. If the preliminary connection terminal 120 and the packing 164 are not adhered closely to each other during a formation of the molding layer 140, the molding layer 140 may be flowed in the hole 162b through a space between the preliminary connection terminal 120 and the packing 164. An inhalation pressure may be applied to the hole 162b during a formation of the molding layer 140 so that the preliminary connection terminal 120 and the packing 164 are adhered closely to each other. For this, the die 160 may further include a vacuum line (not illustrated) connected to the hole 162b.

The molding layer 140 may be formed without using a release tape. Forming the general molding layer 140 typically includes attaching the release tape to one surface of the die 160. The release tape may be used to prevent a shape of the preliminary connection terminal 120 from being deformed when forming the molding layer 140 and to easily separate the semiconductor substrate 110 from the die 160 after forming the molding layer 140. In the present general inventive concept, the packing 164 provided to the die 160 may perform a function of the release tape. More specifically, when forming the molding layer 140, the packing 164 may be provided to surround a circumference of the preliminary connection terminal 120. The packing 164 may minimize and/or prevent a deformation of the preliminary connection terminal 120 due to a pressure applied to the preliminary connection terminal 120 when injecting the molding material. The packing 164 can also easily separate the die 160 from the semiconductor substrate 110. The present general inventive concept can also minimize and/or prevent that a portion of the release tape is melted due to a process environment of a high temperature during a formation of the molding layer 140 to remain on the preliminary connection terminal 120.

Figure 8:
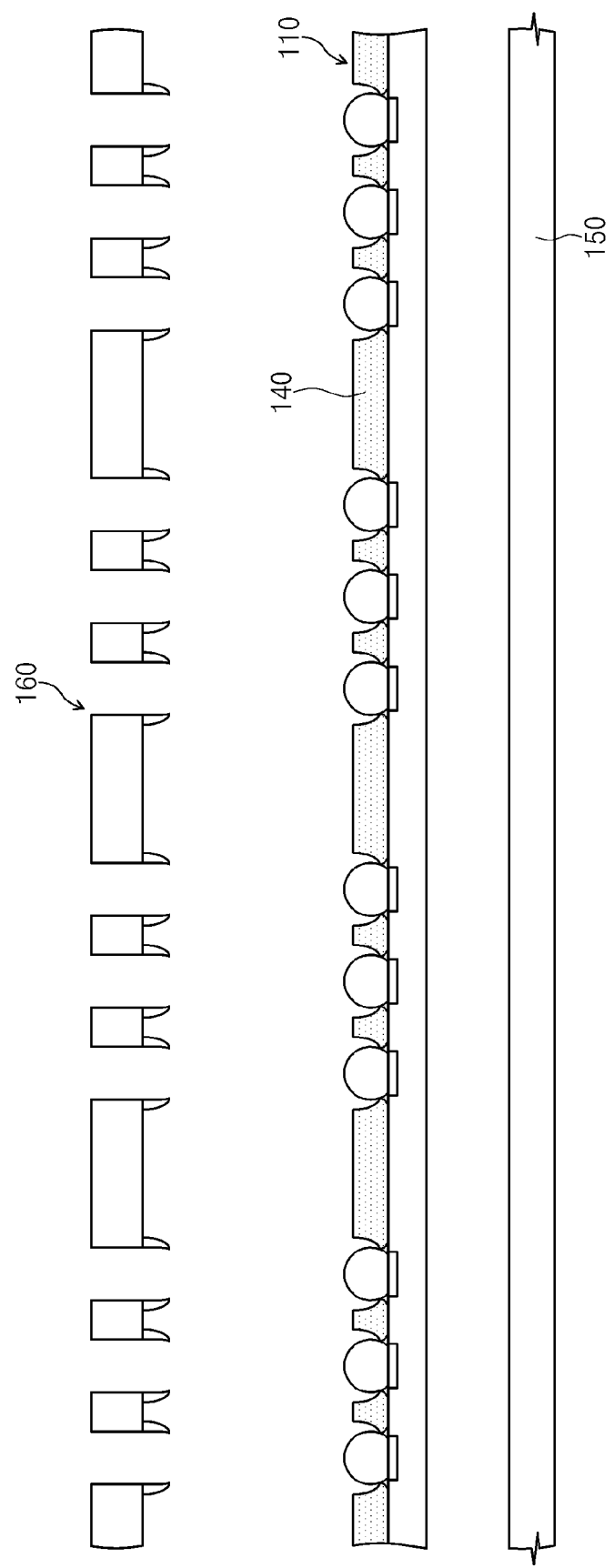

Referring to FIGS. 3 and 8, the carrier 150 and the die 160 are separated from the semiconductor substrate 110 at operation S160. For example, when the molding layer covering the semiconductor substrate 110 is completely formed, the die 160 may be separated from the semiconductor substrate 110 and the carrier 150 may be separated from the semiconductor substrate 110.

Figure 9:
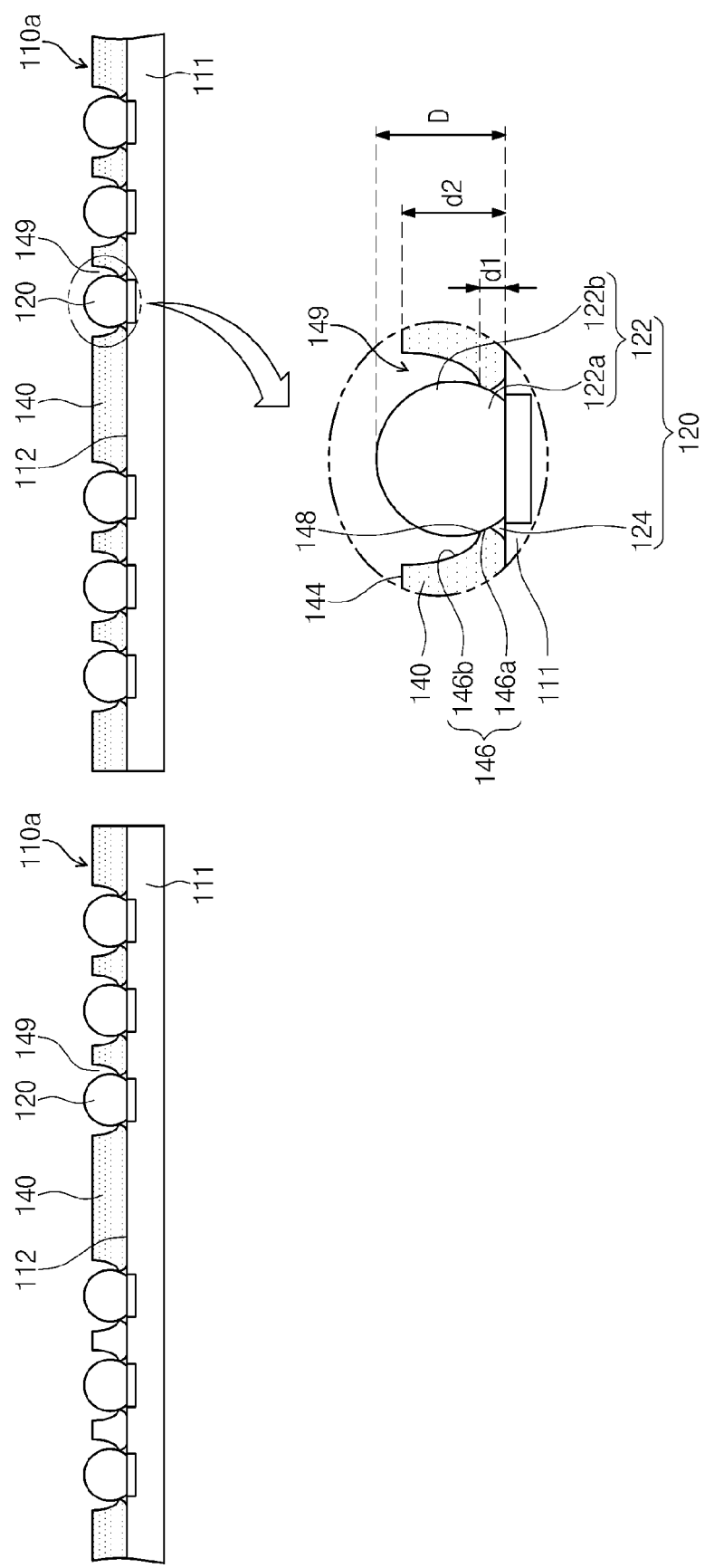

Referring to FIGS. 3 and 9, the first package substrate 110a described in connection with FIG. 1 can be completed by cutting the semiconductor substrate 110 of a wafer level. A plurality of the chip sized first package substrates 110a may be formed by cutting the semiconductor substrate 110 of a wafer level. The first package substrate 110a may include a base substrate 111 having front surfaced 112 on which the preliminary connection terminal 120 is formed and the molding layer 140 of which a region adjacent to a circumference of the preliminary connection terminal 120 is recessed.

The first package substrate 110a may have the molding layer 140 in which a groove 149 is formed. The molding layer 140 may include an inner side surface 142 which is in contact with the substrate 110, an external side surface 144 exposed to the outside and a side surface 146 facing the preliminary connection substrate 120. The side surface 146 may include a first surface 146a which is in contact with the preliminary connection terminal 120 and a second surface 146b which is not in contact with the preliminary connection terminal 120. Since the second surface 146b is spaced apart from the preliminary connection terminal 120 by the packing (e.g., packing 164 illustrated in FIG. 7), a region of the molding layer 140 between the second surface 146b of the molding layer 140 and the preliminary connection terminal 120 may be recessed. The groove 149 may be formed on a region of the molding layer 140 adjacent to a circumference of the preliminary connection terminal 120. In addition, a distance between the second surface 146b and an upper part of the preliminary connection terminal 120 may be changed. For example, a distance between the second surface 146b and an upper part of the preliminary connection terminal 120 at a lower position may be smaller than a distance between the second surface 146b and an upper part of the preliminary connection terminal 120 at an upper position.

A distance between the front surface 112 and the corner 148 (d1, hereinafter, it is referred to as first distance) may be smaller than half of a distance (D) between the front surface 112 and a height of the preliminary connection terminal 120. If the first distance (d1) is greater than half of the distance (D) between the front surface 112 and a height of the preliminary connection terminal 120, a recessed depth of the groove 149 may become shallow. As a depth of the groove 149 becomes shallow, a volume of the groove 149 may be reduced. More specifically, during a reflow process for the preliminary connection terminal 120, the groove 149 may be used as a mold to deform a shape of the preliminary connection terminal 120 so that a joining area of the preliminary connection terminal 120 which is joined to the second package substrate 130 is increased. A volume of the groove 149 may be greater than a volume of a portion of the preliminary connection terminal 120 protruded from the external side surface 144, the preliminary connection terminal 120 may be incompletely joined to the second package substrate 130 during the reflow process. Thus, a volume of the groove 149 may be controlled to be equal to or smaller than a volume of the preliminary connection terminal 120 protruded from the external side surface 144.

Also, a distance (d2, hereinafter, it is referred to as second distance) between the front surface 112 and the external side surface 144 of the molding layer 140 may be smaller than a distance (D) between the front surface 112 and a height of the preliminary connection terminal 120. In addition, the second distance d2 may be greater than half of the distance (D) between the front surface 112 and a height of the preliminary connection terminal 120. The molding layer 140 may have a thickness sufficiently protect the semiconductor substrate 110 from external chemical/physical environments.

As described above, an extent that the molding layer 140 covers the preliminary connection terminal 120 and a depth of the groove 149 may be changed according to a location of the corner 148 which is in contact with the preliminary connection terminal 120. A location of the corner 148 which is in contact with the preliminary connection terminal 120 may be controlled considering an extent that the molding layer 140 covers the preliminary connection terminal 120 and a depth of the groove 149.

Figure 10:
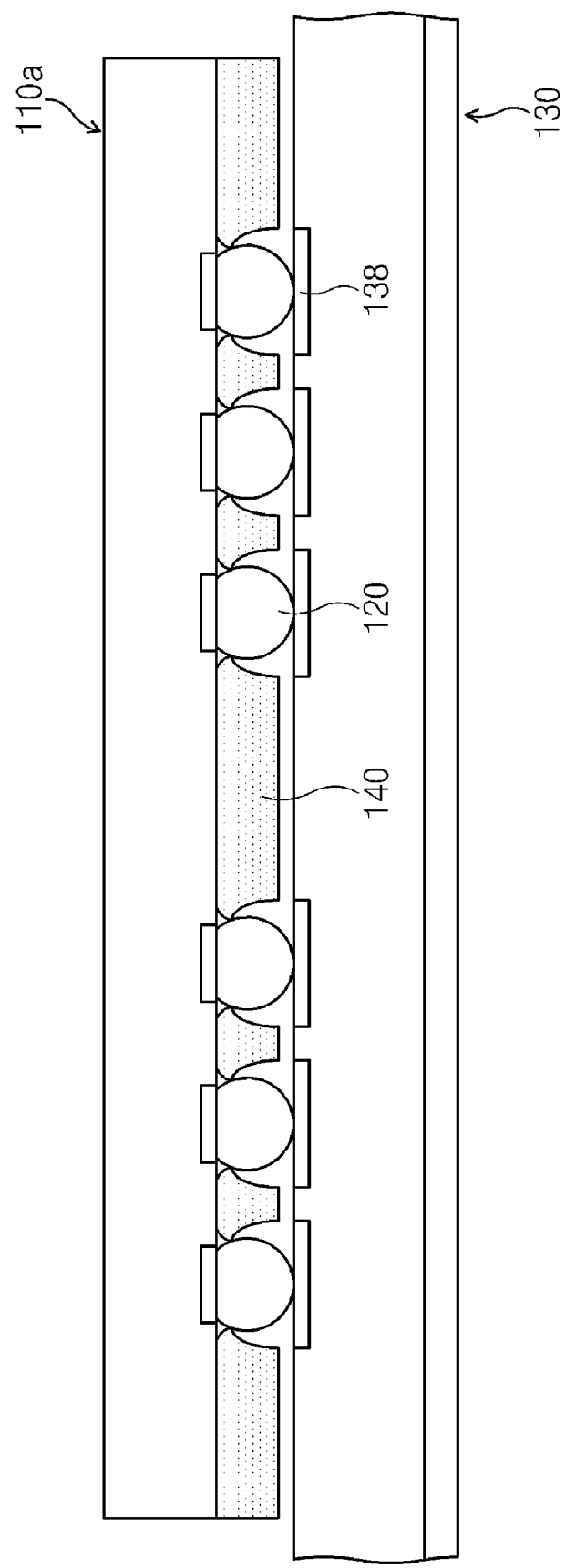

Referring to FIGS. 3 and 10, the first package substrate including the molding layer 140 is disposed on the second package substrate 130 (S180). That is, the first and second package substrates 110a and 130 may be disposed so that the preliminary connection terminal 120 included in the first package substrate 110a is disposed on a ball land region 138 formed on the second package substrate 130. The second package substrate 130 may be a printed circuit board (PCB) substrate.

Figure 11:
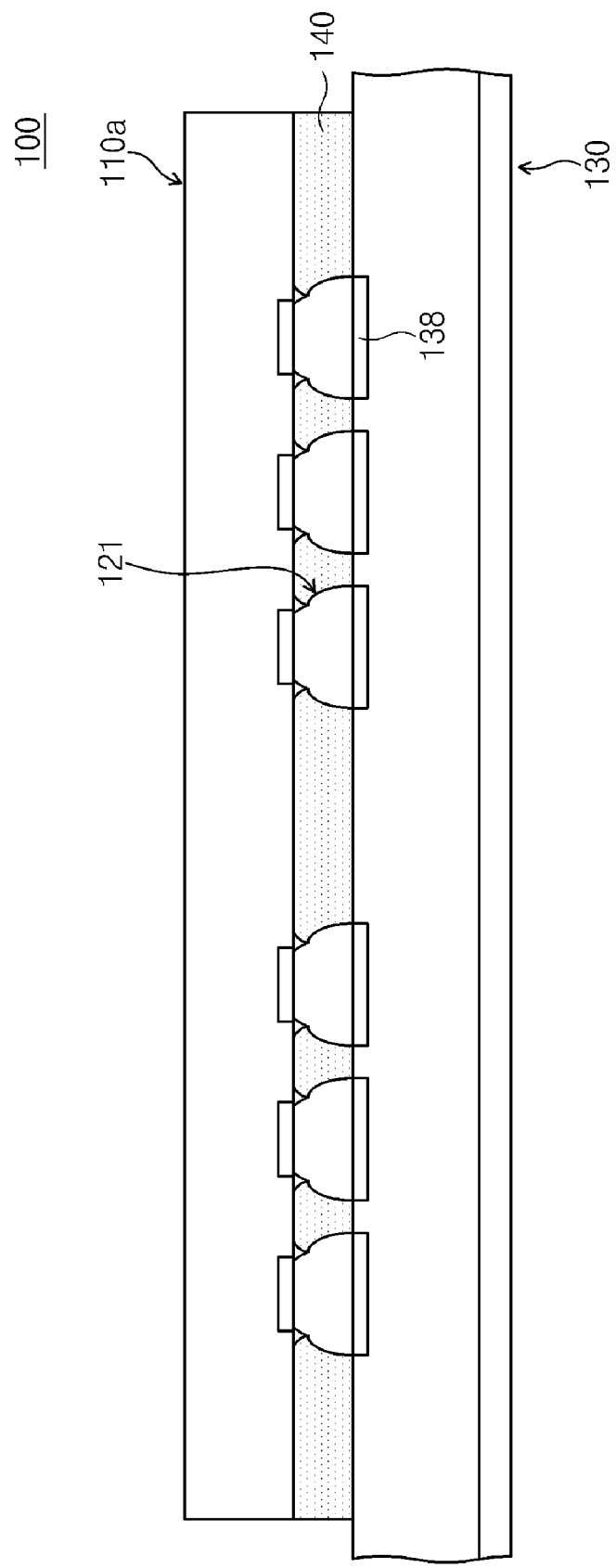

Referring to FIGS. 3 and 11, the semiconductor package 100 illustrated in FIG. 1 may be completed by combining the first package substrate 110a with the second package substrate 130 at operation S190. That is, the preliminary connection terminal 120 included in the first package substrate 110a may be joined to the ball land region 138 of the second package substrate 130 when the preliminary connection terminal 120 is reflowed. The preliminary connection terminal 120 is melted by heating and the preliminary connection terminal 120 may be joined to the ball land region 138 of the second package substrate 130 while a portion of the melted preliminary connection terminal 120 fills the groove 149. Since a shape of the preliminary connection terminal 120 is changed by the groove 149, a connection terminal 121 having an increased joining area may be joined to the second package substrate 130. As illustrated in FIG. 2, the connection terminal 121 includes a first solder portion 123a joined to the first package substrate 110a and a second solder portion 123b joined to the second package substrate 130. A joining area of the second solder portion 123b may be greater than a joining area of the first solder portion 123a.

The semiconductor package 100 having the structure described above may have the connection terminal 121 that a joining area which is joined to the second package substrate 130 is greater than a joining area which is joined to the first package substrate 110a. A joining area of the connection terminal 121 may be increased in the semiconductor package 100 having the structure described above, so that a solder joint reliability (SJR) of the connection terminal 121 may be improved.

Figure 12:
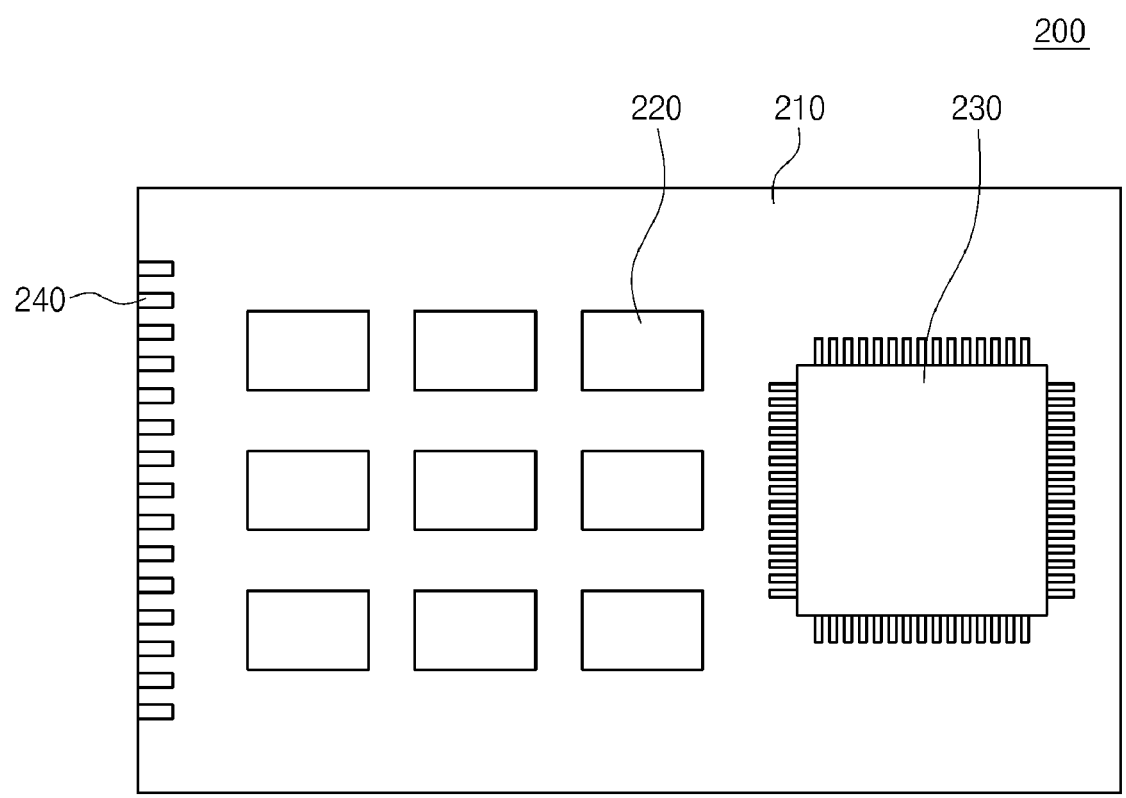
FIG. 12 is an illustrative view of a package module including a semiconductor package to which a technique of the present general inventive concept is applied.

A technique of the semiconductor package described above may be applied to a variety of semiconductor devices and a package module including the variety of semiconductor devices. FIG. 12 illustrates a package module including a semiconductor package to which a technique of the present general inventive concept is applied. Referring to FIG. 12, a package module 200 may be provided as a type such as a semiconductor integrated circuit 220 and a semiconductor integrated circuit 230 packaged with quad flat package (QFP). The package module 200 may be formed by installing semiconductor devices 220 and 230 to which a technique of the present general inventive concept is applied on a substrate 210. The package module 200 may be connected to an external electronic device through an external connection terminal 240 provided onto one side of the substrate 210.

Figure 13:
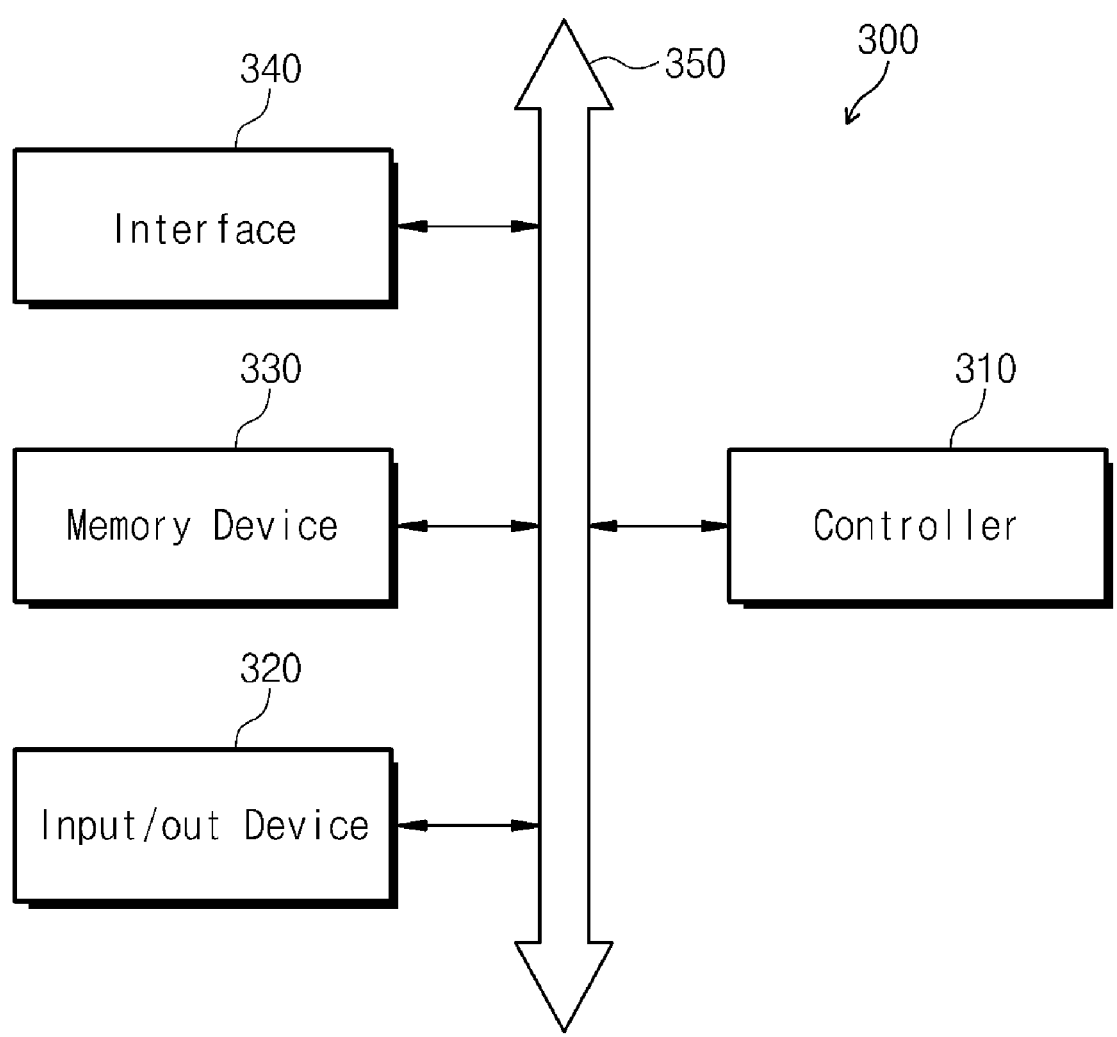
FIG. 13 is a block diagram illustrating an electronic device including a semiconductor device to which a technique of the present general inventive concept is applied.

The technique of the semiconductor package described above may be applied to an electronic system. FIG. 13 is a block diagram illustrating an electronic device including a semiconductor device to which a technique of the present general inventive concept is applied. Referring to FIG. 13, an electronic system 300 may include a controller 310, an input/output device 320 and a memory device 330. The controller 310, the input/output device 320 and the memory device 330 may be connected to each other through a bus 350. The bus 350 may be a path through which data transfers. The controller 310 may include at least one of a microprocessor, a digital signal process, a microcontroller and logic devices that can perform a function similar to the microprocessor, the digital signal process, the microcontroller and the logic devices, or may include any other suitable device. The controller 310 and the memory device 330 may include a semiconductor package according to the present general inventive concept. The input/output device 320 may include at least one selected from a group consisting of a key pad, a key board and a display device, or may be any other suitable device. The memory device 330 is a device storing data. The memory device 330 may store an instruction executed by data and/or the controller 310. The memory device 330 may include a volatile memory device and/or a nonvolatile memory device. The memory device may be formed of a flash memory. For example, a flash memory to which a technique of the present general inventive concept is applied may be installed on an information processing system such as a mobile device (e.g., mobile telephone, personal digital assistant, personal computing device, or other mobile personal electronic device) or a desk top computer. The flash memory may be comprised of a semiconductor disc device. In this case, the electronic system 300 may stably store huge amounts of data in the flash memory system. The electronic system may further include an interface 340 in order to transmit data to a communication network or receive data from a communication network. The interface 340 may be a cable/wireless type. The interface 340 may include an antenna or cable/wireless transceiver. Although not illustrated, an application chipset, a camera image processor (CIS) and an input/output device may be further provided to the electronic system 300.

The electronic system 300 may be embodied to a mobile system, a personal computer, an industrial computer or a logic system performing a variety of functions. For example, the mobile system may be one of a personal digital assistant (PDA), a portable computer, a web tablet, a mobile phone, a wireless phone, a laptop computer, a memory card, a digital music system and data transmission/reception system. If the electronic system 300 is a device that can perform a wireless communication, the electronic system 300 may be used in a communication interface protocol of third generation such as CDMA, GSM, NADC, E-TDMA, WCDMA and CDMA2000.

Figure 14:
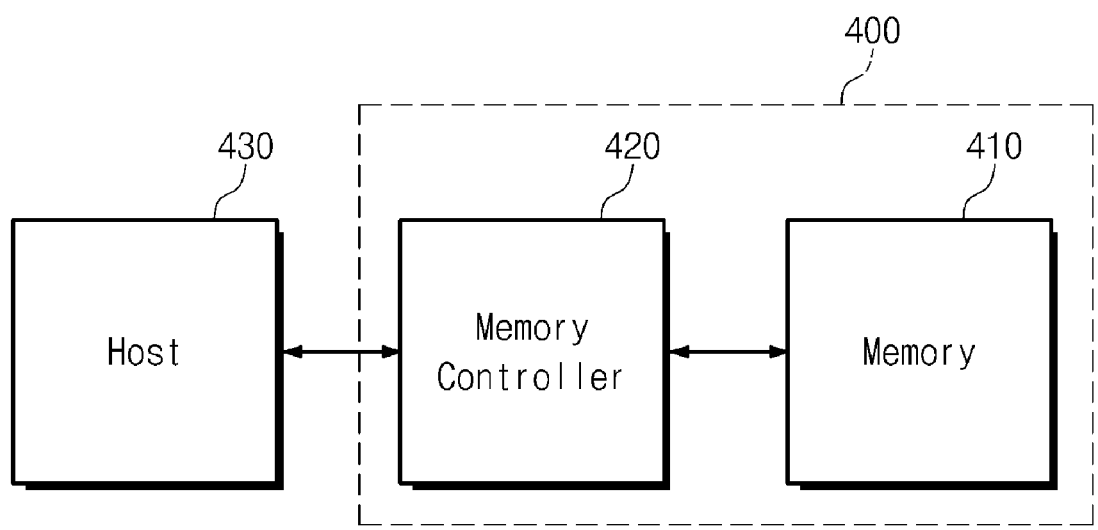
FIG. 14 is a block diagram illustrating a memory system including a semiconductor device to which a technique of the present general inventive concept is applied.

The semiconductor device to which a technique of the present general inventive concept is applied may be provided as a type of a memory card. FIG. 14 is a block diagram illustrating a memory system including a semiconductor device to which a technique of the present general inventive concept is applied. Referring to FIG. 14, a memory card 400 may include a nonvolatile memory device 410 and a memory controller 420. The nonvolatile memory device 410 and the memory controller 420 can store data or decode a stored data. The nonvolatile memory device 410 may include at least one of nonvolatile memory devices to which a semiconductor package or method of semiconductor packaging according to the present general inventive concept is applied. The memory controller 420 may control the flash memory device 410 to read or store data in response to a request of read/write of a host 430.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A semiconductor package, comprising:
a first package substrate including a base substrate having one surface on which a connection terminal is formed and a molding layer covering the base substrate, and
a second package substrate which faces the first package substrate and is combined with the first package substrate,
wherein the molding layer has a side surface facing a circumference of the connection terminal and is not in contact with the second package substrate,
wherein the side surface includes a first surface and a second surface having circumferences of a different size,
wherein the connection terminal is comprised of a first solder portion joined to the first package substrate and a second solder portion joined to the second package substrate,
wherein the first surface is formed to surround a circumference of the first solder portion and the second surface is formed to surround a circumference of the second solder portion,
wherein the circumference of the second surface is greater than the circumference of the first surface.

2. The semiconductor package of claim 1, wherein the second surface is concavely rounded toward the base substrate.

3. The semiconductor package of claim 1, wherein the circumference of the second surface is gradually increased from the first solder portion to the second solder portion.

4. The semiconductor package of claim 1, wherein the second solder portion is formed to extend from the first solder portion.

5. The semiconductor package of claim 1, wherein the first surface is in contact with the circumference of the first solder portion and the second surface is in contact with the circumference of the second solder portion.

6. The semiconductor package of claim 1, wherein the first solder portion includes a polymer collar, and
wherein the first solder portion is in contact with a corner that the first surface and the second surface meet to each other.

7. The semiconductor package of claim 1, wherein the first solder portion includes a polymer collar, and wherein the first surface covers at least the polymer collar.

8. The semiconductor package of claim 1, wherein the first solder portion includes a polymer collar, and wherein a distance between one surface of the base substrate and a corner that the first surface and the second surface meet to each other is greater than a distance between the one surface of the base substrate and a top of the polymer collar.

9. The semiconductor package of claim 1, wherein a distance between one surface of the base substrate and a corner that the first surface and the second surface meet to each other is smaller than half of a distance between the one surface of the base substance and a height of the connection terminal.

10. The semiconductor package of claim 8, wherein a joining area of the second solder portion joined to the second package substrate is greater than a joining area of the first solder portion joined to the first package substrate.

11. The semiconductor package of claim 10, wherein a radius of curvature of the second solder portion is greater than a radius of curvature of the first solder portion.

* * * * *